(12) United States Patent
Takahashi et al.

(10) Patent No.: US 6,733,228 B2
(45) Date of Patent: *May 11, 2004

(54) APPARATUS FOR TRANSPORTING PARTS

(75) Inventors: Shigeki Takahashi, Omihachiman (JP); Nihei Kaishita, Omihachiman (JP); Akira Nemoto, Omihachiman (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/953,161

(22) Filed: Sep. 17, 2001

(65) Prior Publication Data
US 2002/0031426 A1 Mar. 14, 2002

Related U.S. Application Data

(63) Continuation of application No. 09/307,772, filed on May 10, 1999, now Pat. No. 6,338,608.

(30) Foreign Application Priority Data

May 15, 1998 (JP) .......................................... 10-133065

(51) Int. Cl.⁷ ............................................... B65G 59/00
(52) U.S. Cl. ................. 414/798.9; 198/390; 198/459.6; 221/248; 414/798.3; 414/798.6
(58) Field of Search ............................. 198/390, 451.9, 198/459.6, 463.4; 221/298; 414/789.9, 798.2, 798.3, 798.6, 798.9

(56) References Cited

U.S. PATENT DOCUMENTS

| | | | |
|---|---|---|---|
| 3,602,358 A | 8/1971 | Jakobsson | |
| 4,176,993 A | 12/1979 | Luginbuhl | |
| 5,183,181 A | 2/1993 | Sugai | |
| 5,503,299 A | 4/1996 | Smith | |
| 5,836,437 A | 11/1998 | Saito et al. | |
| 6,032,783 A | 3/2000 | Saito et al. | |

FOREIGN PATENT DOCUMENTS

| | | |
|---|---|---|
| EP | 0 439 234 A1 | 7/1991 |
| EP | 0 683 625 | 11/1995 |
| JP | 8-48419 | 2/1996 |

OTHER PUBLICATIONS

European Search report dated Jun. 21, 2000.

*Primary Examiner*—Janice L. Krizek
(74) *Attorney, Agent, or Firm*—Burns, Doane, Swecker & Mathis, LLP

(57) ABSTRACT

A part transporting apparatus comprises: a guiding groove for lining up parts in one row and guiding the parts; a transporting member which is provided at the base of the guiding groove and transports the parts in a forward direction by itself moving forwards and backwards along the groove; and a driving means for reciprocally driving the transporting member in the forward and backward directions; wherein the transporting member is advanced slowly and retracted rapidly, so as to transport the parts forwards. Provided to this arrangement are: a stopper which operates so as to open and close in the width direction of the guiding groove, and hold the second part from the front of the row of parts being transported on the upper plane of the transporting member; and a shutter for opening and closing at the tip of the guiding groove, so as to cover the space above the first part in the row so as to prevent the part from flying out. The shutter is opened synchronously with the transporting member immediately before forward movement of the transporting member is completed, thereby extracting the first part separated from the second part. Such an arrangement provides for an apparatus for transporting parts, wherein the first part and second part can be separated in a sure manner even in the event that the parts are non-magnetic material, and wherein ease and stability of extracting of the first part is facilitated.

2 Claims, 7 Drawing Sheets

APPARATUS FOR TRANSPORTING PARTS

This application is a continuation of application Ser. No. 09/307,772, filed on May 10, 1999, now U.S. Pat. No. 6,338,608.

BACKGROUND OF THE INVENTION

1. Field of the Invention

The present invention relates-to an apparatus for transporting parts, and particularly relates to an apparatus for transporting parts which separates the first part in a row of parts being transported from the second part in this row.

2. Description of the Related Art

Regarding apparatuses for transporting small parts such as chip parts, an apparatus is known wherein an endless belt comprises the bottom of a transporting groove through which parts are guided, and wherein the parts are transported by means of intermittent driving of this belt (see Japanese Unexamined Patent Publication No. 8-48419). In the case of this apparatus, a mechanism is provided for separating the first part in the row on the belt from the second part in the row, so as to allow the first part in the row to be extracted therefrom. This separating mechanism acts so that a stopper is brought into contact with the front-most end of a guiding groove at the time that the parts on the belt move forward with the forward motion of the belt, the first part is stopped at a certain position, and upon the first part coming into contact with the stopper so that motion of all parts is stopped, the second part is held in the same position by a holding pin while the stopper is opened forwards so as to allow the first part to proceed forward while remaining in the state of being attached by a permanent magnet on the stopper, thereby forcibly forming a gap between the first part and the second part.

However, this method in the above separating mechanism involves stopping the movement of all parts, attaching the first part by a permanent magnet provided in the stopper, and pulling this part forward by magnetic force, meaning that the parts cannot be separated in the event that the part is formed of a non-magnetic material, or that debris or the like is on the part such that magnetism does not effectively work. Also, friction occurs between the part and belt at the time of extracting the first part, so there is the possibility that the attachment between the permanent magnet and the part may be separated. Thus, such an arrangement has the problem of being unreliable.

Also, with the above separating mechanism, the space above the first part is opened at the time of using magnetism to attach the first part and move the stopper forwards, so trouble such as the first part flying off of the belt may occur. Such trouble tends to occur particularly when transporting and separating small parts at high speeds. Accordingly, parts cannot be extracted in a stable manner.

SUMMARY OF THE INVENTION

Accordingly, it is an object of the present invention to provide an apparatus for transporting parts, wherein the first part and second part can be separated in a sure manner even in the event that the parts are non-magnetic material, and wherein ease of extracting of the first part is facilitated, in a stable manner.

In order to achieve the above objects, a part transporting apparatus according to a first aspect of the present invention comprises: a guiding groove for lining up parts in one row and guiding the parts; a transporting member which is provided at the base of the guiding groove and transports parts in one direction by itself moving forwards and backwards along the groove; a driving means for reciprocally driving the transporting member in the forward and backward directions; a shutter covering the space over the first part, the shutter being capable of being opened and closed over the tip of the guiding groove; a stopper which operates so as to open and close in the width direction of the guiding groove, and hold the second part from the front of the row of parts being transported on the upper plane of the transporting member; and a synchronizing means for opening and closing the stopper synchronously with the reciprocal forward and backward movement of the transporting member; wherein, once the stopper holds the second part, the transporting member moves forward by a certain distance, thereby separating the first part in the row and the second part, and immediately before the forward movement of the transporting member is completed, the shutter is opened in a manner synchronous with the transporting member.

The first characteristic of the present invention is that the transporting member is reciprocally driven in the forward and backward directions to transport the parts forward, and that once the stopper holds the second part, the transporting member moves further forward, thereby separating the first part and the second part. Accordingly, the driving mechanism is simplified in comparison with known intermittent driving mechanisms using belts, and the first part and second part can be separated in a sure manner even in the event that the part is non-magnetic.

The second characteristic of the present invention is that a shutter covering the space over the first part is provided to the tip of the guiding groove, wherein the shutter is opened in a manner synchronous with the transporting member immediately before the forward movement of the transporting member is completed, so that the first part can be extracted from the guiding groove. In other words, preventing the first part from flying out of the guiding groove at the time of separating the first part and second part enables stable extracting.

In order to prevent the first part from flying out in a sure manner during transporting and separating thereof, it is preferable to keep the space above the part covered with the cover until immediately before extracting. To this end, according to a third aspect of the present invention, the shutter comprises: a cover covering the space over the first part; and a rotating shaft for axially supporting the shutter so as to be rotatable in the forward and backward directions; wherein the transporting member is capable of coming into contact with an intermediate portion between the rotating shaft of the shutter and the cover, so that the shutter is pressed forwards by the transporting member, and the cover of the shutter opens forward at a speed greater than the speed of forward progression of the transporting member. That is, pressing the shutter with the transporting material near the fulcrum of rotation allows the shutter to be opened with minimal movement of the transporting member.

Regarding the method of transporting the parts in one direction with the transporting member, it is preferable that friction is used, according to a second aspect of the invention. That is, the driving means drives the transporting member in a reciprocal manner such that the speed of moving in the backward direction is greater than the speed of moving in the forward direction; wherein the speed of moving in the forward direction is a speed at which holding friction acts between the transporting member and the parts disposed upon the upper surface thereof; and wherein the speed of moving in the backward direction is a speed at which the friction between the transporting member and the parts disposed upon the upper surface thereof is essentially broken. With such an arrangement, the parts can be transported in one direction simply by reciprocal driving of the transporting member, so the transporting mechanism can be simplified, and further, the parts are not restrained, so there is little damage inflicted upon the parts. Incidentally, the term "the friction . . . is essentially broken" includes not only speeds at which friction does not act at all, but also speeds at which the parts do not actually move backwards even if friction does act.

DETAILED DESCRIPTION OF THE PREFERRED EMBODIMENTS

FIGS. 1 through 7 illustrate an example of the apparatus for transporting parts, according to the present invention. Incidentally, chip-type electronic parts are used as the parts P in this embodiment.

Figure 1:
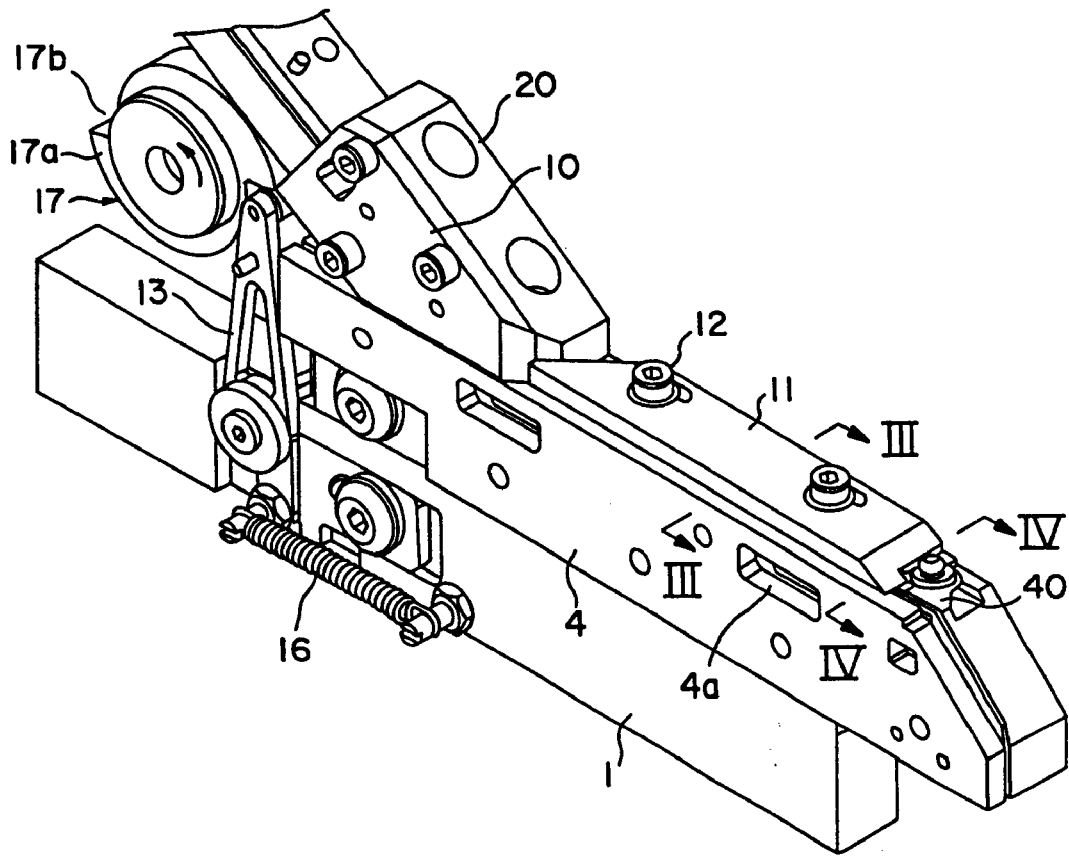
FIG. 1 is a perspective view of a first embodiment of the apparatus for transporting parts according to the present invention.
Figure 2:
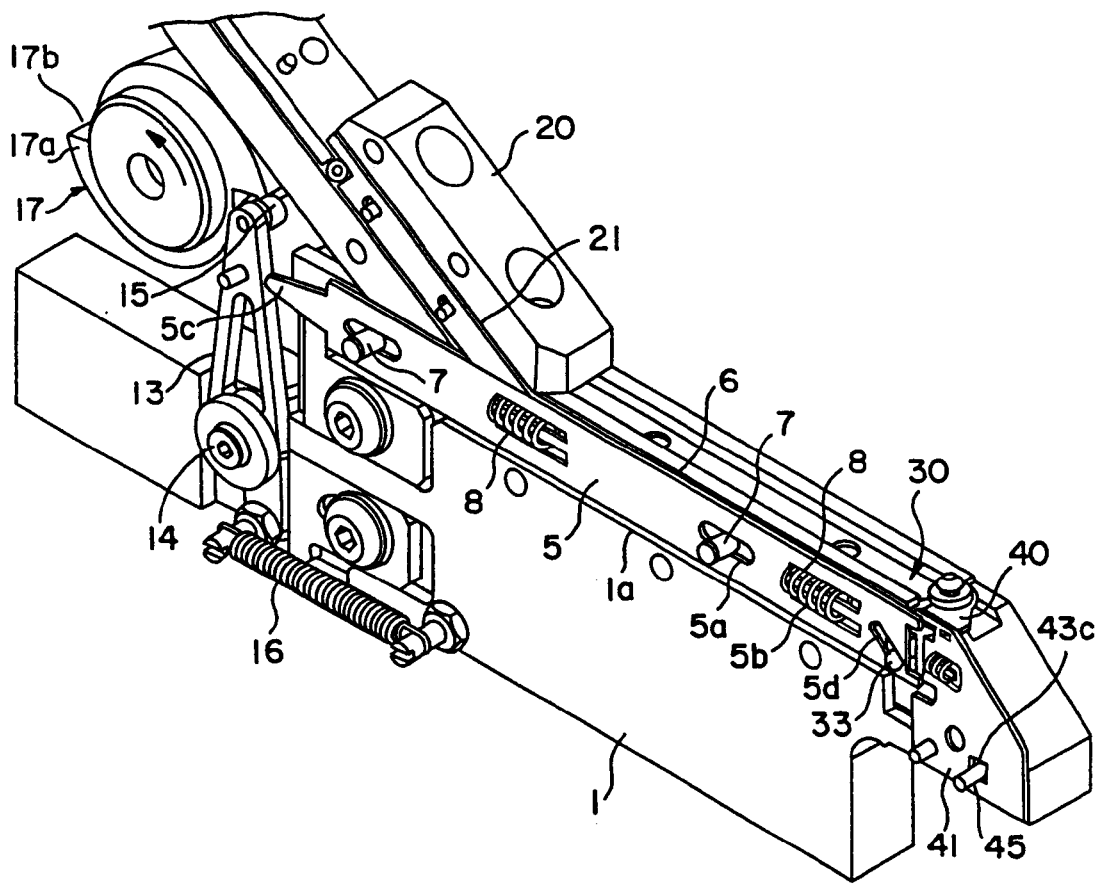
FIG. 2 is a perspective view of the apparatus for transporting parts shown in FIG. 1, with the front cover and upper cover removed.

FIG. 1 is an overall view of the apparatus, and FIG. 2 shows the state thereof with the later-described front covers 4 and 10, and the upper cover 11 removed.

Figure 3:
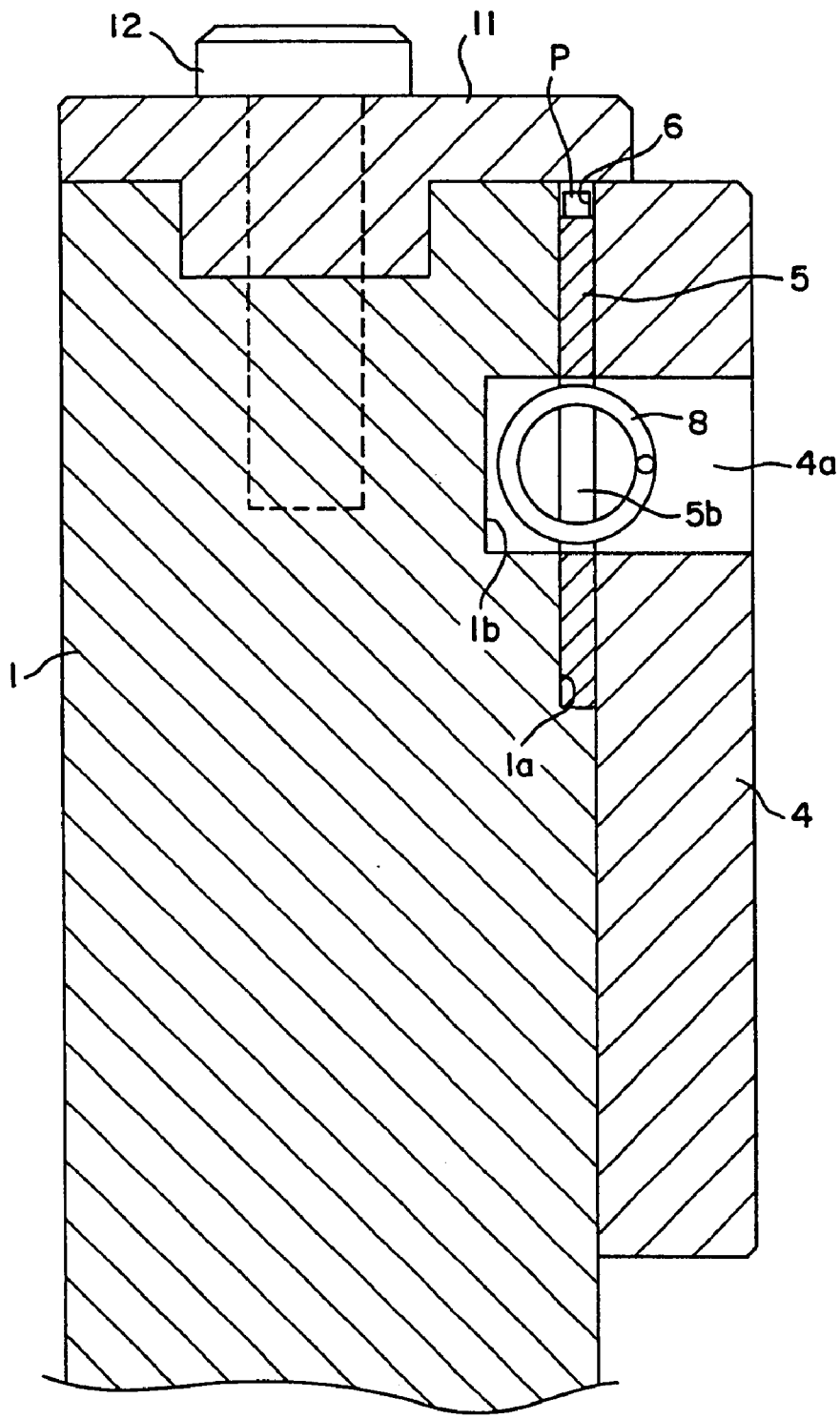
FIG. 3 is a cross-sectional diagram along line III—III in FIG. 1.

A recessed portion 1a is formed at the front of the apparatus proper 1, as shown in FIG. 3, and a narrow space is formed by fixing the front cover 4 to the front of the apparatus proper 1. A blade 5, which is an example of the transporting member, is positioned in this space so as to be slidable in the horizontal direction. A cover 11 is fixed to the upper face of the apparatus proper 1 by means of screws 12 so that the parts P do not fly out at the time of being transported. The inner face of the above recessed portion 1a, the inner face of the front cover 4, the upper plane of the blade 5, and the lower plane of the above upper cover 11, define a guiding groove 6 whereby the parts P are arrayed in one row and guided.

The blade 5 is formed of a thin metal plate, in which are formed elongated holes 5a which is elongated in the forwards/backwards direction, and spring storing holes 5b, as shown in FIG. 2. Guide pins 7 protruding from the apparatus proper 1 are inserted through the elongated holes 5a, thereby guiding the blade 5 in the forwards/backwards direction. Also, springs 8 are stored in the spring storing holes 5b, and both ends of the springs 8 in the radius direction thereof fit into a recessed portion 1b formed in the apparatus proper 1, and an opening 4a formed in the cover 4 (see FIG. 3). The back side of the spring 8 is supported by the spring storing hole 5b, and the front side thereof is supported by the recessed portion 1b and the opening 4a, so that the springs 8 constantly press the blade 5 in the backwards direction.

A The back end portion 5c of the blade 5 comes into contact with the front face of an intermediate lever 13 that is attached to the apparatus proper 1 in a rockable manner, by the force of the springs 8. The center portion of the intermediate lever 13 is rockably supported by a bolt 14, a roller 15 which rotates against the perimeter of a cam 17 is attached to the upper end thereof. A spring 16 has one end attached to the apparatus proper 1, and the other end thereof is attached to the lower end of the intermediate lever 13. Accordingly, the intermediate lever 13 is pressed in a direction such that the roller 15 at the upper end thereof comes into contact with the perimeter of the cam 17. The above springs 8, intermediate lever 13, and cam 17 comprise the driving means for reciprocally driving the blade 5.

As shown in FIGS. 1 and 2, the cam 17 has a raised portion 17a and a lowered portion 17b, and is rotated in the direction indicated by the arrow at a constant speed, by mean of a motor not shown in the drawings. Owing to such an arrangement, the blade 5 advances at a slow speed in accordance with the roller 15 of the intermediate lever 13 riding up on the raised portion 17a of the cam 17, and the blade 5 rapidly retreats in accordance with the roller 15 dropping into the lowered portion 17b of the cam 17. The speed at which the above blade 5 advances depends on the inclination of the raised portion 17a of the cam 17 and the speed of rotation of the cam 17, and is set to a speed such that a certain holding resistance acts between the blade 5 and the parts P on the upper plane thereof. Also, the speed at which the above blade 5 retreats is set to a speed such that the resistance between the blade 5 and the parts P on the upper plane thereof is essentially broken. In this way, the blade 5 is advanced at a slow speed so that friction acts, and is retracted at a fast speed so that friction is broken, so that the parts P can be transported in one direction without providing any particular mechanism for preventing the parts P from moving backwards.

An arraying device 20 for arraying the parts P in single file is provided to the upper side of the rear of the apparatus proper 1, this being fixed in a diagonal manner. A chute groove 21 is formed in the arraying device 20 so that the parts P follow the inclination thereof and slide down, with a front cover 10 covering the front side of this chute groove 21. The bottom end of this chute groove 21 is connected with the end portion of the guiding groove 6, so that the parts P which have slid down the chute 21 enter into the guiding groove 6. At this time, there is a change in angle between the chute 21 and the guiding groove 6, thereby serving to prevent parts P within the guiding groove 6 from returning, by means of the part P at the bottom of the chute groove 21.

A separating groove 30 for separating the first part in the row of parts being transported from the second part therein is provided at the front end of the guiding groove 6. As shown in FIGS. 4 through 6, the separating groove 30 has a second stopper 31 for holding the second part $P_2$ in the row of parts P being transported along the surface of the blade 5, and synchronizing means 32 for rocking (opening/closing) the stopper in a manner synchronous with the forwards/backwards motion of the blade 5. The bottom end 31a of the second stopper 31 is supported by a recessed portion 1c formed in the apparatus proper 1, and the second stopper 31 is free to rock in the width friction of the guiding groove 6. The synchronizing means 32 in the present embodiment is provided to the tip of the blade 5, and is comprised of a first groove 5d inclined diagonally in the forwards/backwards direction, a second groove 4b formed vertically to the inner side of the front cover 4 for guiding the side of the blade 5, a ball 33 inserted so as to straddle the first groove 5d and the second groove 4b, a inclined plane 31b in the longitudinal direction which comes into contact with the ball 33, and a spring 34 which presses the second stopper 31 in the direction of holding a part.

Figure 4A:
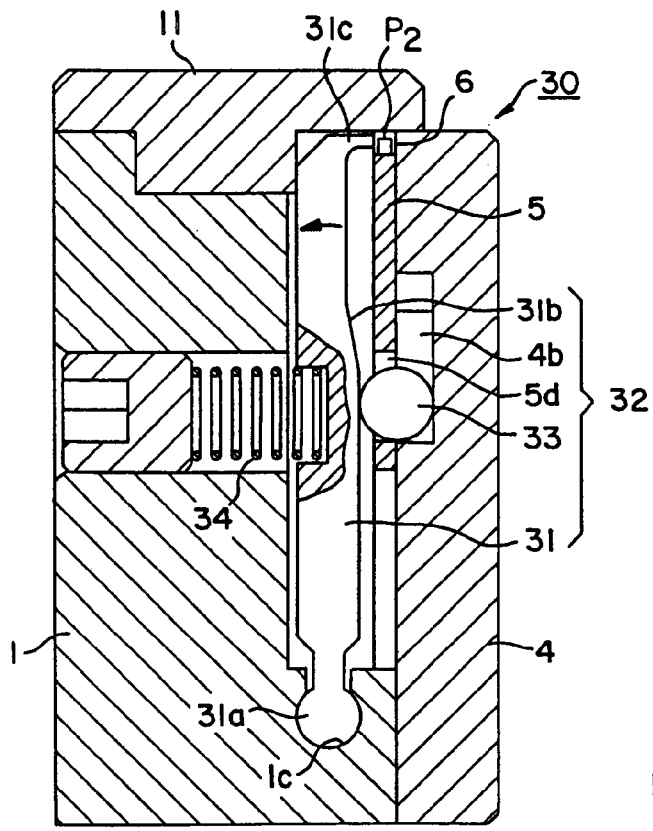
FIG. 4A is a cross-sectional diagram along line IV—IV in FIG. 1, with a part released.
Figure 5:
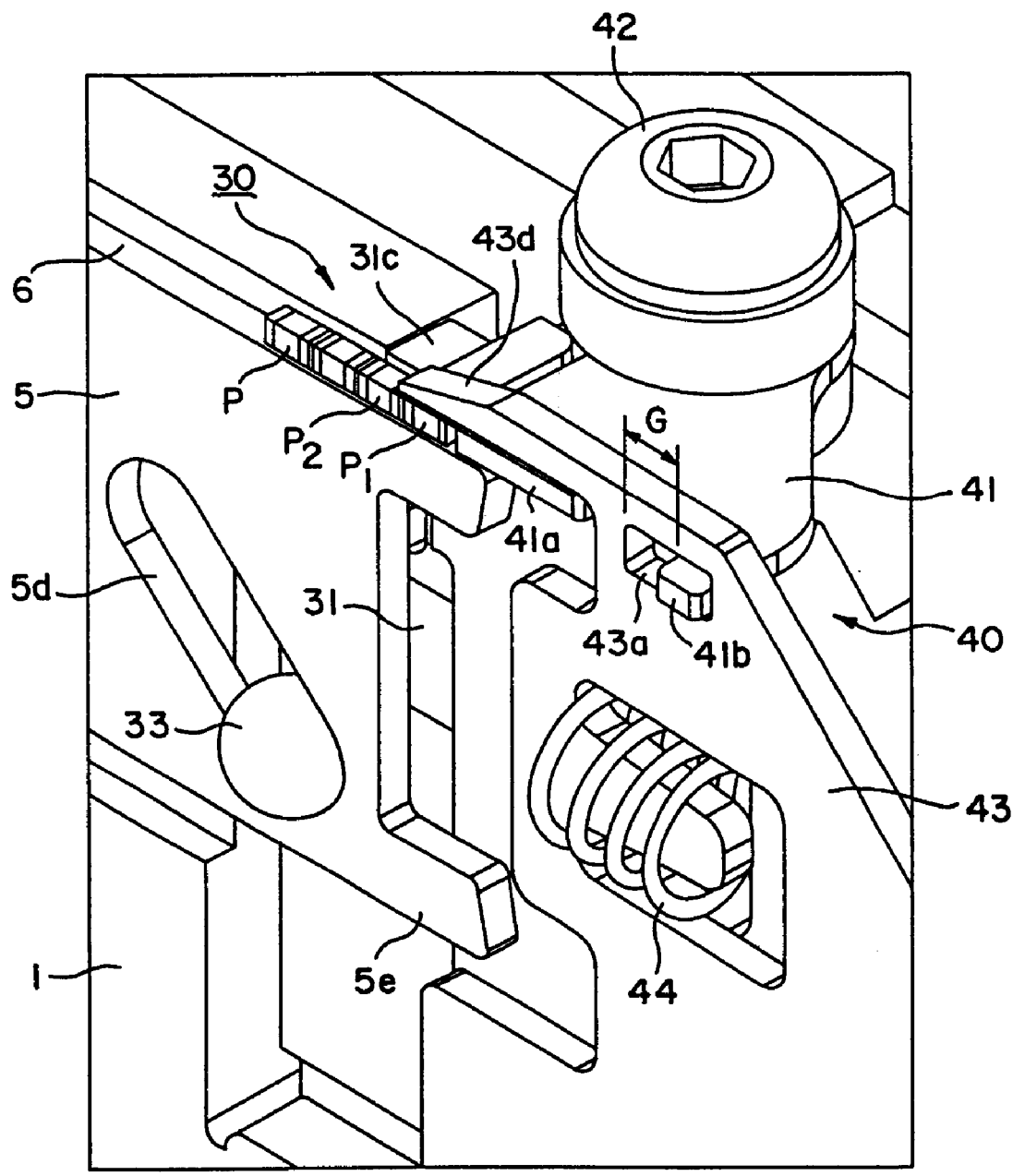
FIG. 5 is an enlarged perspective view of an escape mechanism, before separating.
Figure 6:
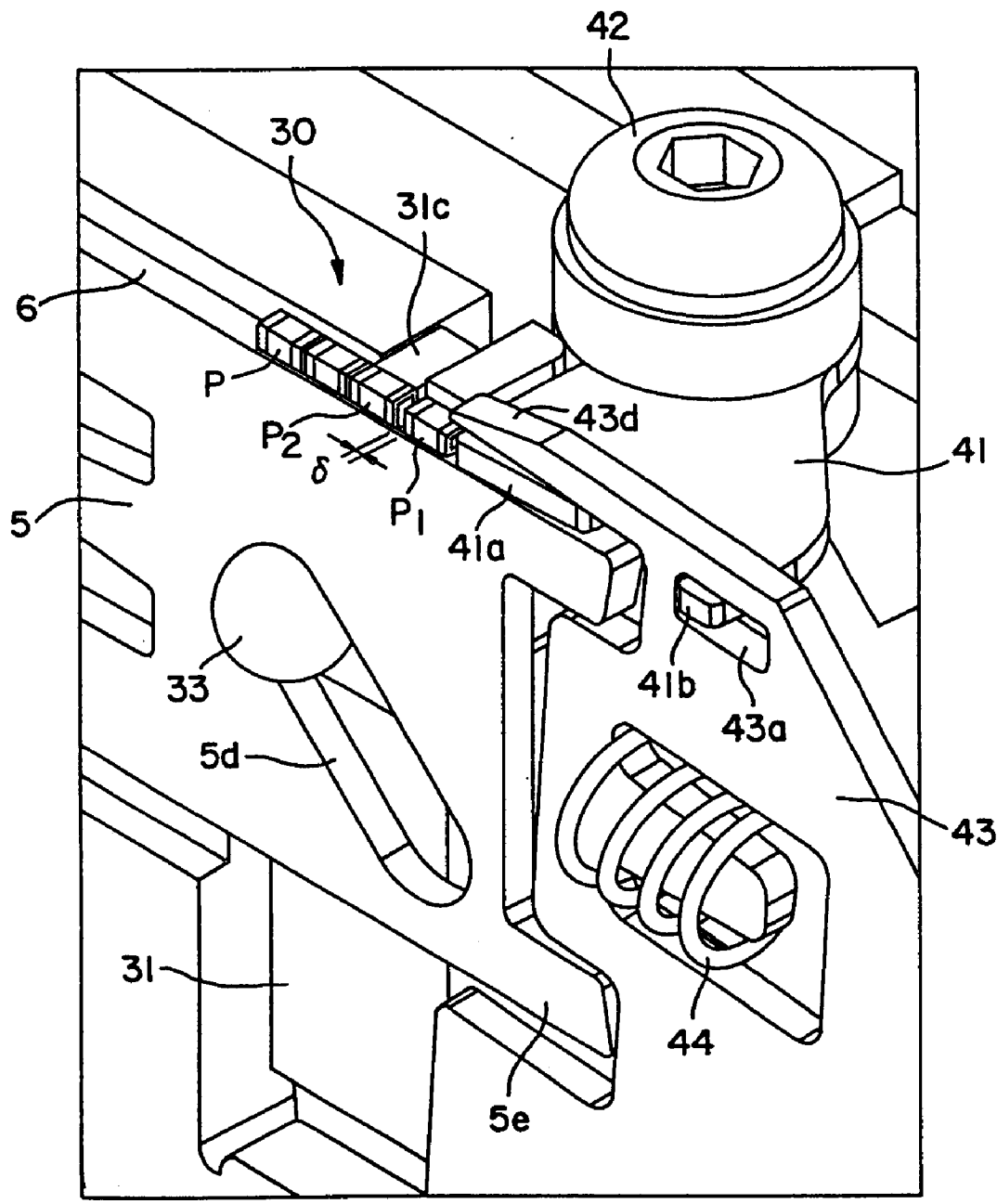
FIG. 6 is an enlarged perspective view of the escape mechanism, after separating.

When the blade 5 is at the retracted position, the ball 33 is at the lower end of the first groove 5d and second groove 4b, as shown in FIG. 4A and FIG. 5. Accordingly, the ball 33 is situated at a position lower than the inclined plane 31b of the second stopper 31, pressing the second stopper 31 in the direction of opening. Accordingly, the part $P_2$ within the guiding groove 6 is not held.

Figure 4B:
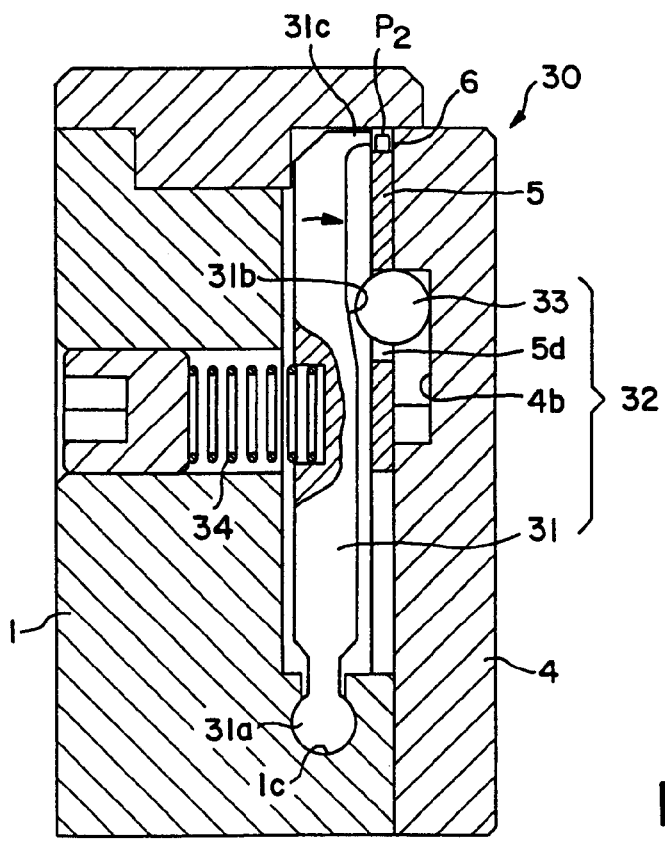
FIG. 4B is a cross-sectional diagram along line IV—IV in FIG. 1, with a part held.

When the blade moves forward, the difference in angle between the first groove 5d and second groove 4b causes the ball to move upwards as shown in FIG. 4B and FIG. 6, so that the ball 33 corresponds with the inclined surface 31b of the second stopper 31. Accordingly, the force of pressing the second stopper 31 open is disengaged, the second stopper 31 rocks in the direction of closing by means of the spring 34, thereby the part $P_2$ is held between the tip portion 31c of the second stopper 31 and the inner face of the guiding groove 6.

Further, when the blade 5 retreats, the difference in angle between the first groove 5d and second groove 4b causes the ball 33 to move downwards, the ball rides up on the inclined plane 31b of the second stopper 31, thereby pressing open the second stopper 31. Accordingly, the part $P_2$ within the guiding groove 6 can move freely.

As shown in FIGS. 5 to 7C, provided to the tip portion of the guiding groove 6 is an escape mechanism 40 which maintains the stopping position of the first part $P_1$ constant at the time that the first part $P_1$ and the second part $P_2$ are separated, and which presses the first part $P_1$ back so as to secure a gap δ between the first part $P_1$ and the second part $P_2$ in the event that an error occurs in extracting the first part $P_1$ for some reason.

The escape mechanism comprises a first stopper 41 rotatably provided to the tip of the guiding groove 6 with a shaft 42 as the center of rotation thereof, and a synchronizing member 43 which rotates the first stopper forwards synchronously with the blade 5 immediately before the blade 5 completes its forward movement, and which rotates the first stopper backwards following the retreat of the blade 5. The first stopper 41 has a first protrusion 41a for stopping the first part, and a second protrusion 41b. The synchronizing member 43 also serves as a shutter for keeping a certain gap G between the blade 5 and the first stopper 41 so as to synchronize the two. This gap G is provided by the gap between a hole 43a in the shutter 43 and the first protrusion 41b. The shutter 43 can be rocked forwards or backwards on the rotating shaft 43b (see FIG. 2), and is pressed backwards by a spring 44 (in the direction corresponding with the blade 5). Incidentally, as shown in FIG. 2, a pin 45 protruding from the apparatus proper 1 is inserted into the hole 43c in the shutter 43, thereby restricting the rocking angle of the shutter 43. Integrally provided on the top of the shutter 43 is a cover 43d which covers the upper side of the first part $P_1$, so as to keep the space above the first part $P_1$ closed off until immediately before extracting the first part $P_1$ from the guiding shaft 6, thereby preventing the first part $P_1$ from flying out during transporting or separating.

Now, the operation of the above escape mechanism 40 will be described with reference to FIGS. 7A through 7C.

Figure 7A:
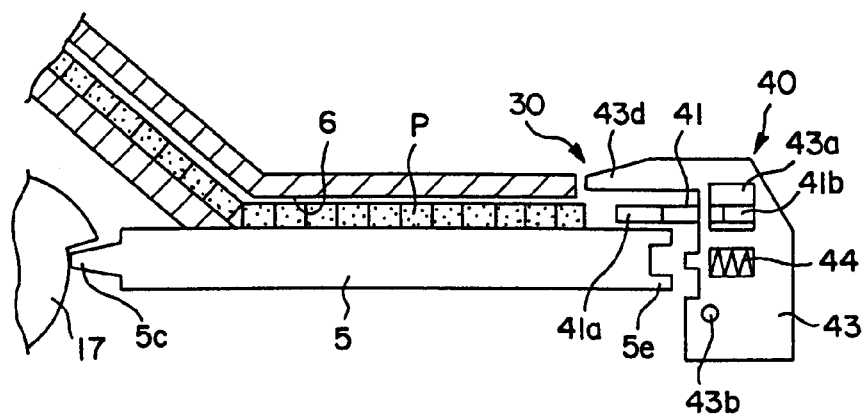
FIGS. 7A through 7C are explanatory diagrams illustrating the operation of the escape mechanism.

FIG. 7A is an initial state, from which the blade 5 moves forward at low speed by the cam 17, and the parts P on the blade 5 also advance.

Figure 7B:
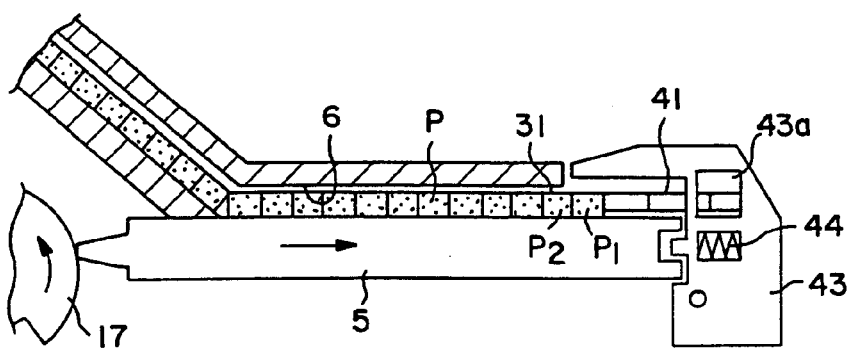

FIG. 7B shows a state wherein the tip of the blade 5 neighbors the shutter 43, and the first part $P_1$ is in contact with the rear plane of the first protrusion 41a of the first stopper 41. In this state, the second part $P_2$ is pressed against the inner plane of the guiding groove 6 by the second stopper 31 and thus held.

When the blade 5 further advances from the state shown in FIG. 7B, the first part $P_1$ advances along with the blade 5 while still in contact with the rear side of the first protrusion 41a of the first stopper 41, since the second part $P_2$ is held by the second stopper 31, and thus the part $P_1$ is separated from the second part $P_2$. The tip 5e of the blade 5 presses the shutter 43, so the shutter 43 also rotates forwards along with the progression of the blade 5, but the first stopper 41 does not rotate synchronously with the shutter 43, and begins rotating after being delayed by an amount equivalent to the gap G.

Figure 7C:
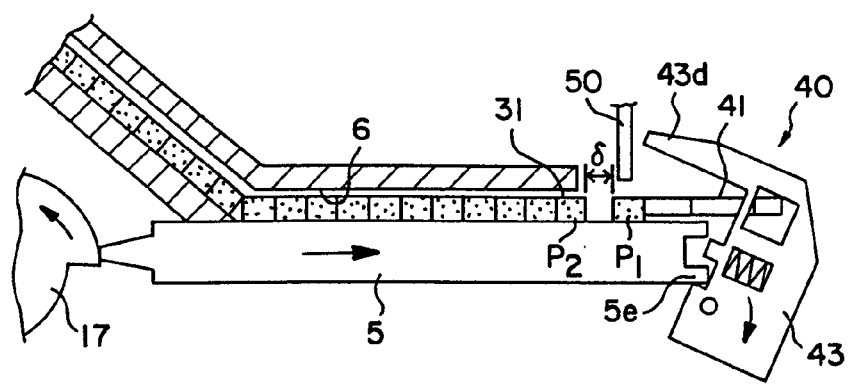

FIG. 7C shows the state of the blade 5 having reached the fore-most position. The point of contact of the shutter 43 and tip 5e of the blade 5 is close to the rotating shaft 43b, so the speed of the cover 43d of the shutter 43 is faster than that of the blade 5, and the cover 43d of the shutter 43 is designed to open immediately prior to the blade 5 reaching the fore-most position. Accordingly, the space above the first part $P_1$ is covered with the cover 43d of the shutter 43 until immediately before extraction, thereby preventing flying out of the guiding groove 6.

In this way, the first part $P_1$ is separated from the second part $P_2$ and held at a certain position in contact with the rear side of the first stopper 41, with the cover being open, so the first part $P_1$ can easily be extracted by an extracting device 50 such as a mounter.

Incidentally, in the event that there has been an extracting failure by the extracting device 50, the first part $P_1$ is pressed back to the position of the second part $P_2$ by the first stopper 41, so that separation can be repeated.

Though FIGS. 7A through 7C show and example wherein the shutter 43 rotates in accordance with the advance of the blade 5, following which the first stopper 41 rotates, but the operation may be reverse to this. That is to say, an arrangement may be employed wherein the separation is performed by the first stopper 41 rotating, following which the shutter 43 rotates to open the space above the first part $P_1$. In any case, the arrangement should be configured such that the shutter 43 opens immediately prior to completion of the forward movement of the blade 5.

It should be noted that the present invention is by no means restricted to the above embodiments.

In the above embodiments, a case is described wherein the shutter 43 also serves as a synchronizing member which transmits the movement of the blade 5 to the first stopper 41, but an arrangement may be used wherein the shutter 43 and the first stopper 41 operate independently.

The driving means for reciprocally driving the transporting member (blade 5) is not restricted to a combination of springs 8, an intermediate lever 13, and cam 17; rather, the intermediate lever 13 may be omitted so that the rear end of the blade 5 comes into direct contact with the perimeter of the cam 17. Also, a rack-and-pinion mechanism may be used instead of the cam, or other various types of mechanisms may be used. The driving source is not restricted to a rotational motion mechanism such as a motor, but may rather be a linear motion mechanism instead.

In the above embodiments, friction owing to difference in speed between the transporting member (blade) and parts was used as the method for transporting the parts in one direction, but instead, a mechanism may be provided at the rear of the guiding groove, for example, in order to prevent the parts from moving backwards. The mechanism for preventing backwards movement may employ the difference in angle between the above chute 21 and guiding groove 6, or a mechanism may be separately provided which acts to hold the parts only when the transporting member is moving backwards. In this case, the holding mechanism is released at the time of the transporting member advancing, so the parts move forwards on the transporting member, but the holding mechanism holds the sides of the parts at the time of the transporting member retracting, thereby preventing the parts from moving forwards.

Also, the means for synchronizing the forwards/backwards movement of the transporting member 5 with the opening/closing movement of the stopper is not restricted to a combination of grooves 4b and 5d, a ball 33 and a second stopper 31 as in the above embodiments; rather, a stopper may be positioned in a horizontal direction, so as to open and close by a protrusion on the side of the transporting member 5 coming into contact with the inclined plane of the stopper 31.

Also, the arrangement is not restricted to such wherein the stopper 31 is opened and closed in a manner directly synchronous with the movement of the blade (transporting member) 5; rather, a separate transmitting member for transmitting the movement of the cam 17 to the stopper 17 may be provided instead, for example. Or, in the event that the driving means is comprised of a mechanism other than a cam, this driving means may be driven synchronously with the stopper.

Also, in the above embodiments, the second part $P_2$ is held between the inner face of the guiding groove and stopper; but a pair of stoppers capable of opening and closing may be provided on either side of the guiding groove, so as to hold the second part $P_2$ between these stoppers.

Further, neither is the transporting member restricted to a blade; rather, any material capable of forming the bottom of the guiding groove and moving forwards and backwards may be used. Also, parts which can be transported by the present invention are not limited to square chips; rather, any sort of parts may be transported as long as the parts are capable of being arrayed in one row and transported through the guiding groove.

As can be clearly understood from the above description, with the apparatus for transporting parts according to the present invention, parts are transported forwards along a guiding groove by a reciprocally driven transporting member, and a second stopper holds the second part in the row, following which the transporting member is further move forwards, whereby the first part in the row and the second part are separated. Accordingly, even non-magnetic members can be separated in a sure manner, and the shortcomings of the known method using magnetism can be overcome. Consequently, the first part can be easily extracted from the guiding groove.

Also a shutter covering the space over the first part is provided to the tip of the guiding groove, and the shutter is opened in a manner synchronous with the transporting member immediately before the forward movement of the transporting member is completed, so any flying of the first part out of the guiding groove can be reasonably prevented, thereby facilitating stable extracting.

What is claimed is:

1. A part transporting apparatus, comprising:

a guiding groove in which a row of parts are adapted to be lined up in one row and guided;

a transporting member having a surface defining an upper plane thereon, which transporting member is provided at a base of the guiding groove and is adapted to transport parts in a forward direction by moving forward and backward along the groove;

a driving means for reciprocally driving the transporting member forward and backward;

a shutter covering a space over a first part of the parts, the shutter being capable of being opened and closed over a tip of the guiding groove;

a stopper that is movable between an open and a closed position relative to the guiding groove and is adapted, when in the closed position, to hold a second part of the parts stationary against a surface of the guiding groove; and first synchronized means for opening and closing the stopper and second synchronized means for opening and closing the shutter, the first and second synchronized means being driven synchronously by the transporting member;

wherein, after the first synchronized means closes the stopper to cause the stopper to hold the second part, the driving means moves the transporting member forward and separates the first part from the second part and, before forward movement of the transporting member by the driving member is completed, the second synchronized means opens the shutter.

2. A part transporting apparatus according to claim 1, further comprising extracting means for extracting from the guiding groove the first part which has been separated from the second part.

* * * * *